(12) United States Patent
Eom

(10) Patent No.: US 8,951,700 B2
(45) Date of Patent: Feb. 10, 2015

(54) METHODS OF MANUFACTURING OPTICAL FILTERS AND METHODS OF MANUFACTURING ORGANIC LIGHT EMITTING DISPLAY DEVICES HAVING OPTICAL FILTERS

(71) Applicant: Tae-Jong Eom, Yongin (KR)

(72) Inventor: Tae-Jong Eom, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/966,352

(22) Filed: Aug. 14, 2013

(65) Prior Publication Data

US 2014/0134770 A1    May 15, 2014

(30) Foreign Application Priority Data

Nov. 9, 2012    (KR) ......................... 10-2012-0126419

(51) Int. Cl.
    *G03F 7/20* (2006.01)
(52) U.S. Cl.
    USPC .............................................. 430/7; 430/321
(58) Field of Classification Search
    None
    See application file for complete search history.

(56) References Cited

U.S. PATENT DOCUMENTS

2003/0067569 A1*  4/2003  Chang et al. ................... 349/106
2005/0106477 A1*  5/2005  Park ................................. 430/7

FOREIGN PATENT DOCUMENTS

| JP | 2000-098126 A | * | 4/2000 |
| JP | 2003-043939 A | | 2/2003 |
| JP | 2004-239981 A | | 8/2004 |
| KR | 10 2003-0058213 A | | 7/2003 |

OTHER PUBLICATIONS

Computer-generated transaltion of JP 2000-098126 (Apr. 2000).*

* cited by examiner

*Primary Examiner* — John A. McPherson
(74) *Attorney, Agent, or Firm* — Lee & Morse, P.C.

(57) ABSTRACT

A method of manufacturing an optical filter includes preparing a substrate having a panel region, a peripheral region, and an alignment region, forming an outer black matrix on the substrate, such that the outer black matrix surrounds the panel region, forming a dummy black matrix on the substrate, such that the dummy black matrix is in the peripheral region while exposing the alignment region, forming a first color photoresist layer on the substrate to cover the outer black matrix and the dummy black matrix, forming a first color pattern in the panel region and an alignment pattern in the alignment region by patterning the first color photoresist layer, forming a second color photoresist layer on the substrate, forming a second color pattern in the panel region by patterning the second color photoresist layer, and forming a third color pattern in the panel region.

17 Claims, 9 Drawing Sheets

SECOND
DIRECTION

FIRST
DIRECTION

METHODS OF MANUFACTURING OPTICAL FILTERS AND METHODS OF MANUFACTURING ORGANIC LIGHT EMITTING DISPLAY DEVICES HAVING OPTICAL FILTERS

CROSS-REFERENCE TO RELATED APPLICATION

This application claims priority under 35 USC §119 to Korean Patent Application No. 10-2012-0126419 filed on Nov. 9, 2012, in the Korean Intellectual Property Office (KIPO), the entire disclosure of which is incorporated herein by reference.

BACKGROUND

1. Field

Example embodiments relate to methods of manufacturing optical filters and to methods of manufacturing organic light emitting display devices including optical filters. More particularly, example embodiments relate to methods of manufacturing optical filters having improved optical characteristics and to methods of manufacturing organic light emitting display devices including the optical filters.

2. Description of the Related Art

Organic light emitting diode (OLED) display devices display information of images or characters by using light generated by combination of holes and electrons, which are provided from an anode and a cathode, respectively, at an organic light emitting layer interposed between the anode and the cathode. The OLED display devices have been spotlighted as next-generation display devices because the OLED display devices have various advantages, e.g., a wide viewing angle, a rapid response speed, a thin thickness, and low power consumption.

The OLED display devices may additionally include optical filters to adjust the wavelengths of the emitted light. For example, the optical filters may include a plurality of color patterns.

SUMMARY

Some example embodiments provide a method of manufacturing an optical filter having an improved optical characteristic.

Some example embodiments provide a method of manufacturing an OLED display device including an optical filter having an improved optical characteristic.

According to example embodiments, there is provided a method of manufacturing an optical filter including preparing a substrate having a panel region, a peripheral region, and an alignment region, forming an outer black matrix on the substrate, such that the outer black matrix surrounds the panel region, forming a dummy black matrix on the substrate, such that the dummy black matrix is in the peripheral region while exposing the alignment region, forming a first color photoresist layer on the substrate to cover the outer black matrix and the dummy black matrix, forming a first color pattern in the panel region and an alignment pattern in the alignment region by patterning the first color photoresist layer, forming a second color photoresist layer on the substrate to cover the outer black matrix, the dummy black matrix, the first color pattern, and the alignment pattern, forming a second color pattern in the panel region by patterning the second color photoresist layer, and forming a third color pattern in the panel region.

Forming the alignment pattern may include forming an alignment pattern having a higher light transmittance than a light transmittance of the dummy black matrix, and having a thickness of about one to 1.5 times thicker than a thickness of the dummy black matrix.

Forming the second color pattern may include providing an exposure mask opposite the substrate, aligning the exposure mask with the substrate by using the alignment pattern, and partially exposing the second color photoresist layer by using the exposure mask.

Forming the alignment pattern may include using a material identical to a material of the first color pattern.

The first color pattern and the alignment pattern may exhibit high transmittance of a blue light.

Forming the alignment pattern may include reducing a step difference between the alignment region and the peripheral region.

Forming the second color photoresist layer may include a spin coating process.

Forming the alignment pattern may include forming a pattern having a shape of a cross, a triangle, a circle, or a rectangle, when viewed in a plan view.

Forming the first color photoresist layer may include using a negative photoresist.

Forming the dummy black matrix may include depositing the dummy black matrix to a same thickness as the outer black matrix.

Forming the first color pattern and the alignment pattern may be simultaneous, the alignment pattern filling a space between a dummy black matrix and an adjacent outer black matrix.

Forming the alignment pattern may include forming the alignment pattern to a same thickness as each of the dummy black matrix and outer black matrix.

According to other example embodiments, there is provided a method of manufacturing an organic light emitting diode display device including forming a display panel including a switching device, a first electrode, an organic light emitting structure, a second electrode, a plurality of pixel regions arranged in a first direction and a second direction perpendicular to the first direction, and a non-pixel region surrounding the pixel regions, and forming an optical filter on the display panel, forming the optical filter including preparing a substrate having a panel region, a peripheral region, and an alignment region, forming an outer black matrix on the substrate, such that the outer black matrix surrounds the panel region, forming a dummy black matrix on the substrate, such that the dummy black matrix is in the peripheral region while exposing the alignment region, forming a first color photoresist layer on the substrate to cover the outer black matrix and the dummy black matrix, forming a first color pattern in the panel region and an alignment pattern in the alignment region by patterning the first color photoresist layer, forming a second color photoresist layer on the substrate to cover the outer black matrix, the dummy black matrix, the first color pattern, and the alignment pattern, forming a second color pattern in the panel region by patterning the second color photoresist layer, and forming a third color pattern in the panel region.

Forming the alignment pattern may include forming an alignment pattern having a higher light transmittance than a light transmittance of the dummy black matrix, and having a thickness of about one to 1.5 times thicker than a thickness of the dummy black matrix.

Forming the second color pattern may include providing an exposure mask opposite the substrate, aligning the exposure mask with the substrate by using the alignment pattern, and partially exposing the second color photoresist layer by using the exposure mask.

Forming the alignment pattern may include reducing a step difference between the alignment region and the peripheral region.

Forming the second color photoresist layer may include a spin coating process.

BRIEF DESCRIPTION OF THE DRAWINGS

Example embodiments will become more apparent to those of ordinary skill in with reference to the attached drawings, in which.

DETAILED DESCRIPTION

Figure 1:
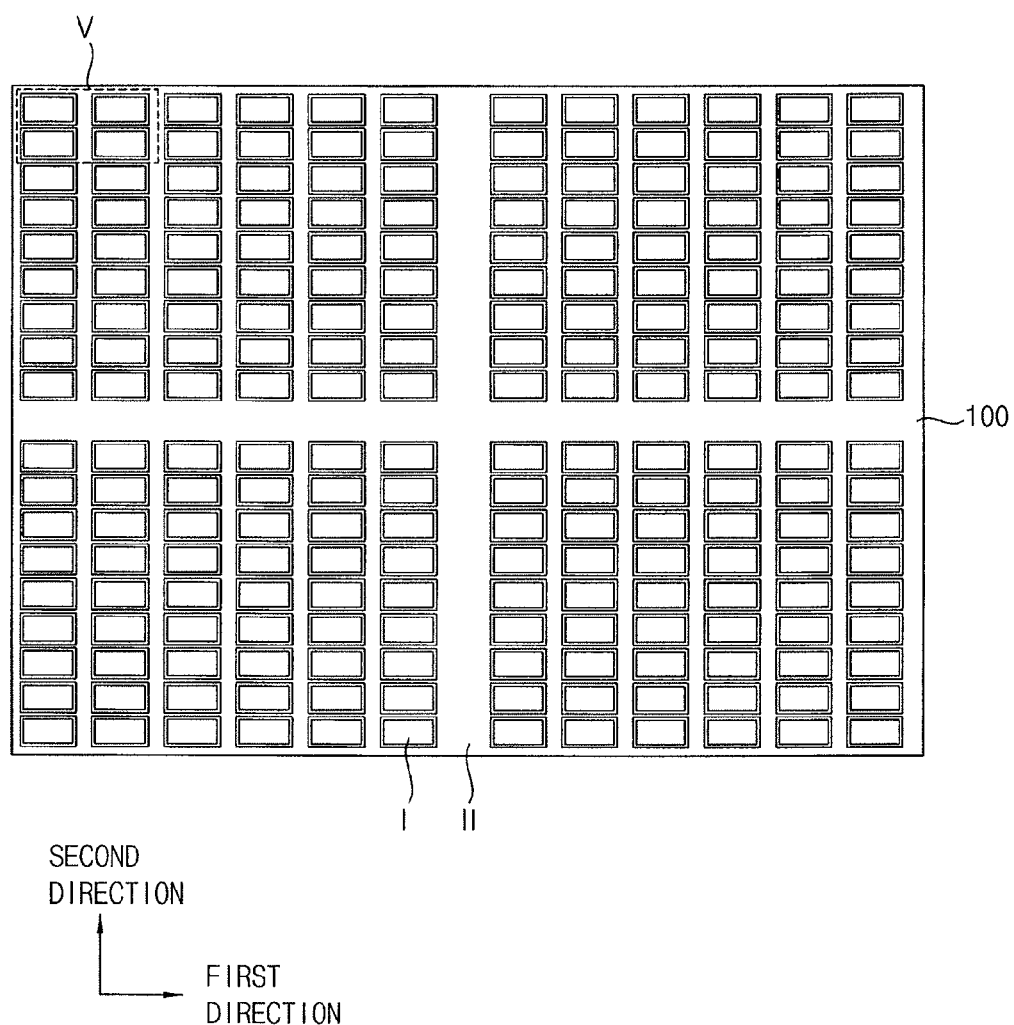
FIGS. 1 to 12 are plan views and cross-sectional views of a method of manufacturing an optical filter according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
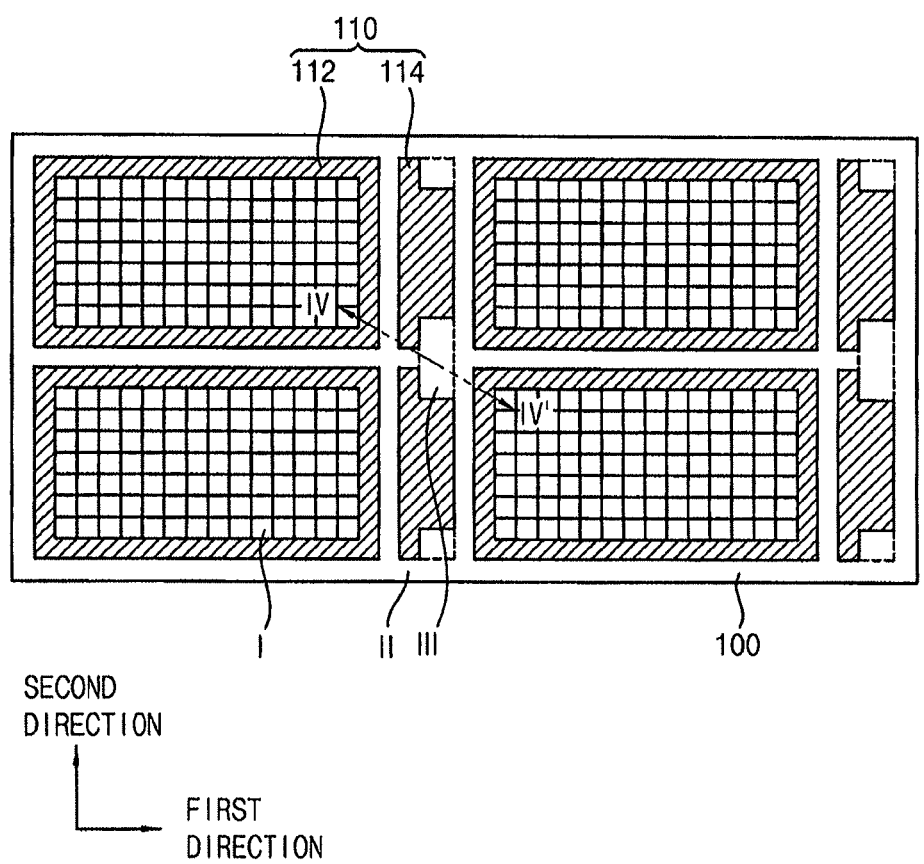
Figure 3:
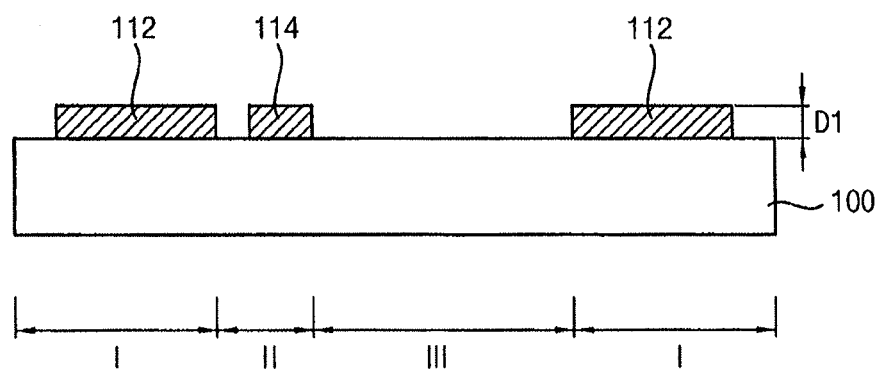
Figure 6:
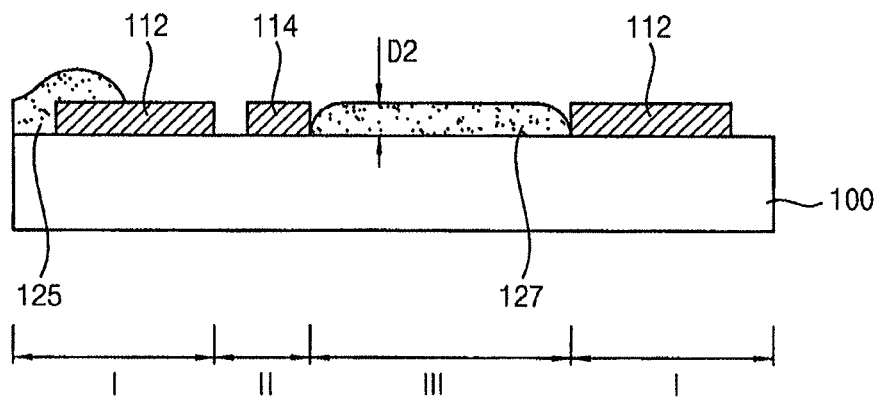
Figure 7:
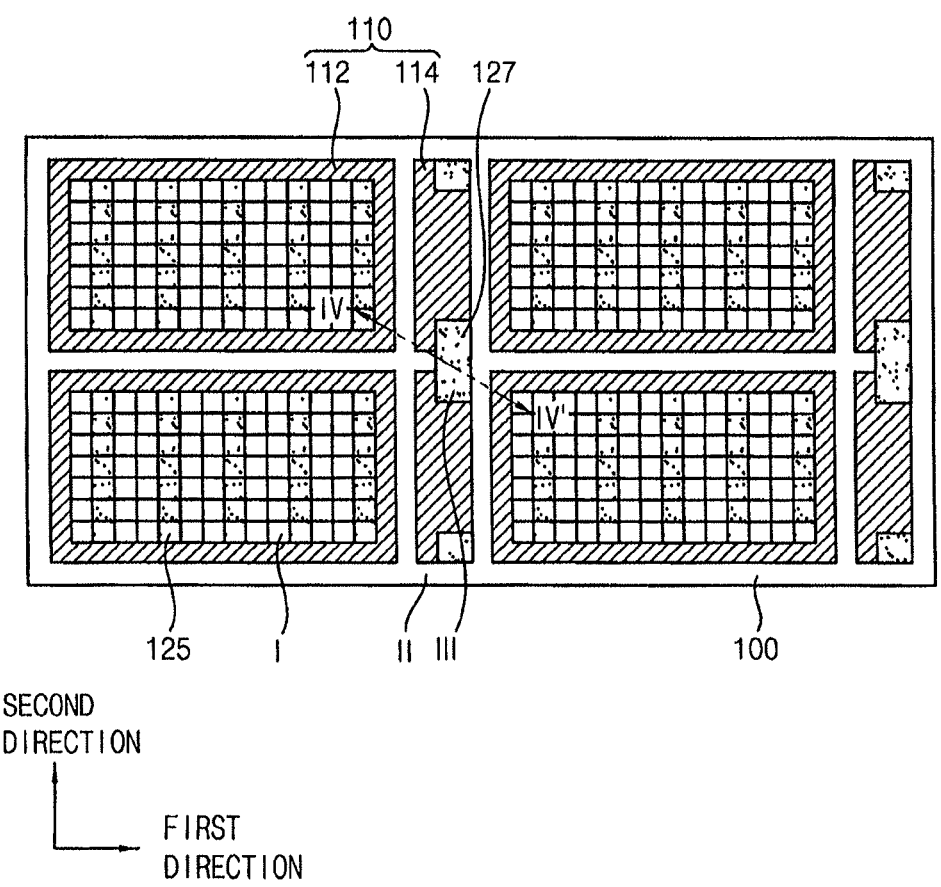
Figure 8:
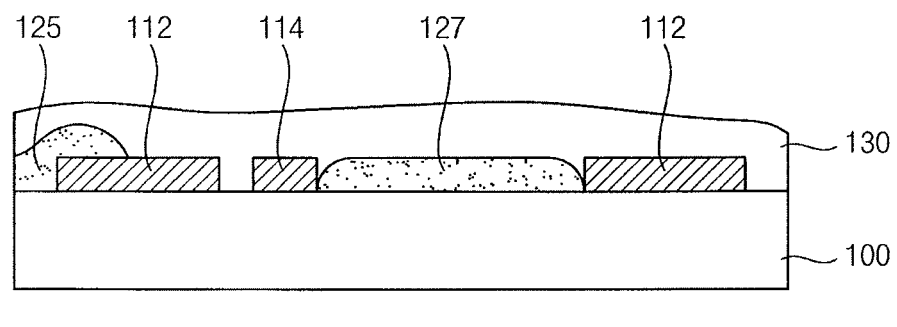
Figure 9:
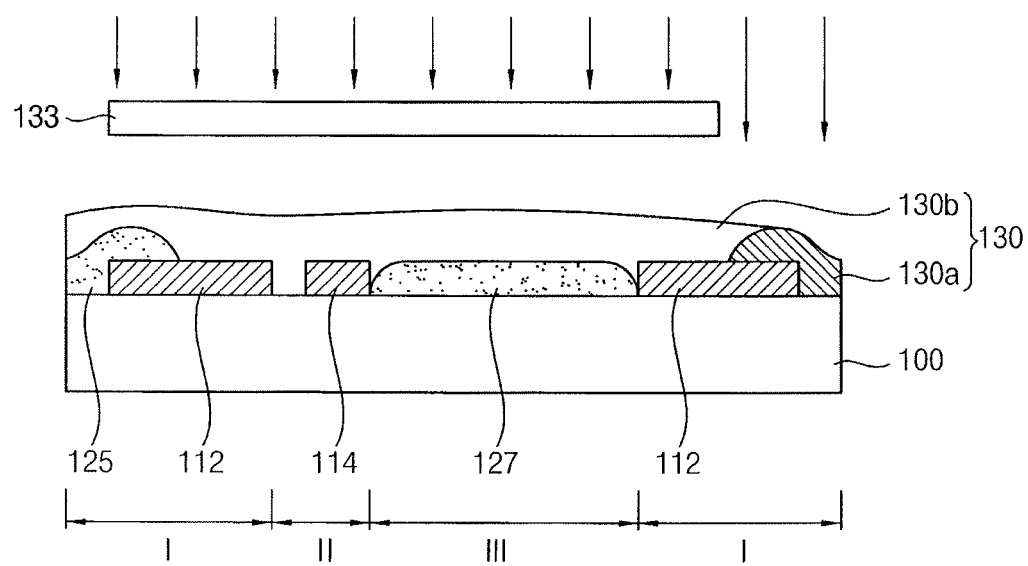
Figure 10:
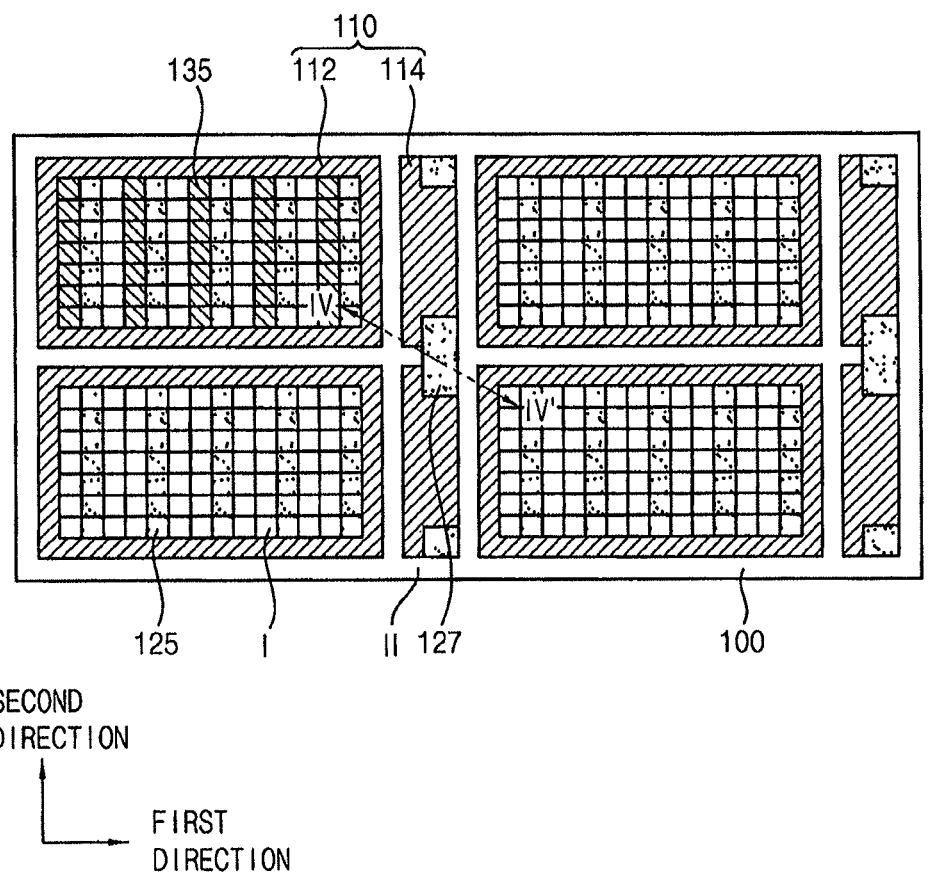
Figure 11:
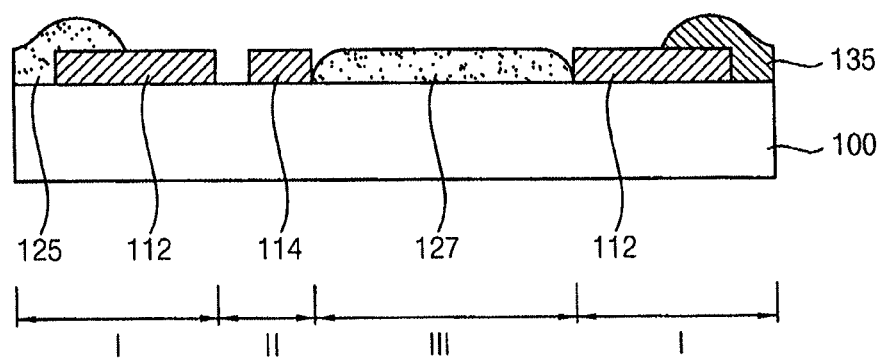

FIGS. 1 to 12 are plan views and cross-sectional views of a method of manufacturing an optical filter according to example embodiments. FIG. 1 is a plan view of a method of manufacturing the optical filter, and FIGS. 2, 7, 10, and 12 are enlarged plan views illustrating part V of FIG. 1. FIGS. 3, 4, 5, 6, 8, 9, and 11 are cross-sectional views of the method of manufacturing the optical filter. In particular, FIGS. 3, 8, and 11 are cross-sectional views taken along line IV-IV' of FIGS. 2, 7, and 10, respectively.

Referring to FIG. 1, a substrate 100 may be divided into a panel region I, a peripheral region II, and an alignment region III (FIGS. 2-3). The substrate 100 may include a transparent material. For example, the substrate 100 may include alkali-free glass, quartz, and transparent plastic.

In detail, the substrate 100 may be divided into the panel region I serving as an optical filter and having color filters arranged thereon, the peripheral region II surrounding the panel region I, and the alignment region III. The panel region I may have the shape and the size corresponding to those of a light emitting part of a display panel. A plurality of panel regions I may be provided in a first direction and a second direction perpendicular to the first direction. In addition, the peripheral region II may surround the alignment region III to align the substrate 100 with a mask (see FIG. 2).

Referring to FIGS. 2 and 3, a black matrix 110 may be formed on the substrate 100. The black matrix 110 may be formed by performing a patterning process using a photoresist pattern as a mask, after a black matrix layer (not illustrated) and a photoresist layer are sequentially coated on the substrate 100, and the photoresist layer is patterned through an exposure process and a development process to form the photoresist pattern.

According to example embodiments, the black matrix layer may be formed by using a polymer including black pigments. If the black matrix layer includes the polymer, the black matrix 110 may have a superior strength to that of a black matrix layer including metal, e.g., chromium (Cr). That is, the black matrix 110 including the polymer and/or the substrate 100 may not be damaged by an external impact.

The black matrix 110 may include an outer black matrix 112 provided in the panel region I and a dummy black matrix 114 provided in the peripheral region II.

The outer black matrix 112 may surround the panel region I. According to the example embodiments, when the panel region I has a rectangular shape, the outer black matrix 112 may have a shape of a rectangular strip when viewed from a plan view. A plurality of outer black matrices 112 may be provided in the first direction and second direction according to the arrangement of the panel regions I. The outer black matrix 112 may prevent light leakage in a lateral direction and may block external light.

The dummy black matrix 114 may be interposed between the outer black matrices 112 in the peripheral region II, e.g., between two black matrices 112 adjacent in the first direction. According to the example embodiments, the dummy black matrix 114 may be spaced apart from, e.g., each of, the outer black matrices 112 by a predetermined distance. A plurality of dummy black matrices 114 may be provided in the first and second directions, e.g., the dummy black matrices 114 may be adjacent to each other and aligned along the second direction while alternating with the outer black matrices 112 in the first direction.

The dummy black matrix 114 may have a first thickness D1, i.e., height along a vertical direction, substantially equal to a thickness of the outer black matrix 112 (FIG. 3). According to the example embodiments, the dummy black matrix 114 and the outer black matrix 112 may have a thickness of about 0.5 μm to about 2 μm, e.g., about 1 μm to about 1.5 μm. Accordingly, the dummy black matrix 114 may compensate for a step difference between the panel region I having the outer black matrix 112 and the peripheral region II.

The dummy black matrix 114 may not be provided in the alignment region III. In other words, as illustrated in FIG. 2, the dummy black matrix 114 may expose a portion of the substrate 100 located in the alignment region III. The substrate 100 may include a transparent material. Thus, the alignment region III exposed by the dummy black matrix 114 may have a higher light transmittance than that of a region having the dummy black matrix 114. In a subsequent process, the substrate 100 and the mask may be aligned with each other through the alignment region III.

A step difference may be formed between an upper surface of the substrate 100 in the alignment region III and an upper surface of the dummy black matrix 114 in the peripheral region II. According to some example embodiment, the alignment region III may be interposed between two dummy black matrices 114 adjacent to each other in the second direction. According to another example embodiment, the alignment region III may be adjacent to one dummy black matrix 114.

Figure 4:
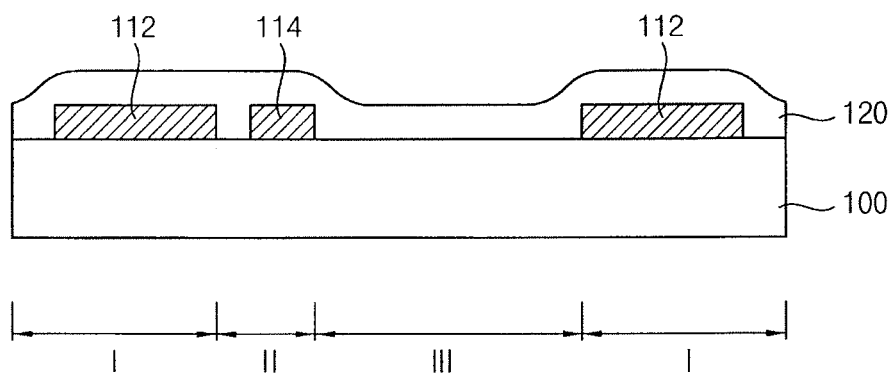

Referring to FIG. 4, a first color photoresist layer 120 may be formed on the substrate 100 to cover the outer black matrix 112 and the dummy black matrix 114. In detail, a color photoresist material may be coated on the substrate 100 through a spin coating process, and then a soft baking process may be performed to form the first color photoresist layer 120. The color photoresist material may include, e.g., a photosensitive resin, a photoacid generator, and pigments. According to the example embodiments, the color photoresist material may further include, e.g., a de-blocking group, an adhesion group, a wet-able group, and an etch resistance supplementation group. According to the example embodiments, the first color photoresist layer 120 may include blue pigments representing high transmittance with respect to blue light. However, the present inventive concept is not limited thereto, and the first color photoresist layer 120 may include green pigments or red pigments.

The soft baking process may be performed at a temperature of about 90° C. to about 110° C. Accordingly, an adhesive strength between the color photoresist material coated through the spin coating process and the substrate 100 (or black matrix 110) may be improved, and a solvent existing in the color photoresist material is evaporated, so that the first color photoresist layer 120 may be formed in the solid state.

Figure 5:
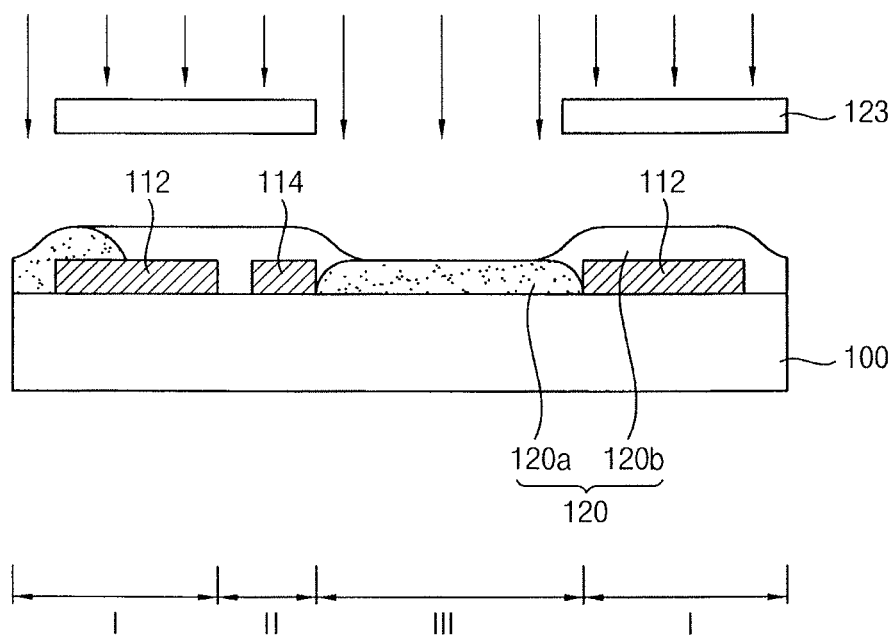

Referring to FIG. 5, the first color photoresist layer 120 may be partially exposed by using a first exposure mask 123. According to the exposure process, the first exposure mask 123 having a predetermined pattern is above the substrate 100 having the first color photoresist layer 120, and the first exposure mask 123 is aligned with the substrate 100 by using the alignment region III. Then, the first color photoresist layer 120 is selectively exposed.

According to the alignment step, after detecting a location of the alignment region III, the first exposure mask 123 may be aligned based on the location of the alignment region III. As described above, since the alignment region III has a higher transmittance than that of the dummy black matrix 114, the location of the alignment region III may be easily detected.

The light irradiated in the exposure step may photo-chemically react with the photosensitive resin of the first color photoresist layer 120 to form a first exposure part 120*a*, i.e., a portion of the first color photoresist layer 120 exposed to the light, and a first non-exposure part 120*b*, i.e., a portion of the first color photoresist layer 120 shielded from the light by the first exposure mask 123. Accordingly, the first exposure part 120*a* and the first non-exposure part 120*b* may have chemical properties different from each other. For instance, the first exposure part 120*a* and the first non-exposure part 120*b* may have different solubilities with respect to a specific solvent.

Referring to FIGS. 6 and 7, a first color pattern 125 and an alignment pattern 127 may be formed by patterning the first color photoresist layer 120. That is, the first non-exposure part 120*b* may be removed by using a developer representing higher solubility with respect to the first non-exposure part 120*b*. Accordingly, a portion of the first color photoresist layer 120 remaining in the panel region I may be defined as the first color pattern 125, and a portion of the first color photoresist layer 120 remaining in the alignment region III may be defined as the alignment pattern 127. For example, the alignment pattern 127 may, e.g., completely, fill a space in the alignment region III between the dummy black matrix 114 and an adjacent outer black matrix 112.

The alignment pattern 127 may have a second thickness D2 defined from the upper surface of the substrate 100. According to the example embodiments, the second thickness D2 of the alignment pattern 127 may be thicker than or substantially equal to the first thickness D1 of the black matrix 110. For instance, the second thickness D2 of the alignment pattern 127 may be about 1 time to about 1.5 times thicker than the first thickness D1 of the black matrix 110. In other words, due to the alignment pattern 127, the step difference formed between the upper surface of the black matrix 110 and the upper surface of the alignment pattern 127 may be smaller than the first thickness D1, or the step difference may not be formed. That is, due to the alignment pattern 127, the step difference around the alignment region III is reduced.

Meanwhile, the alignment pattern 127 may include a same material as that of the first color pattern 125. According to the example embodiments, the alignment pattern 127 may include blue pigments representing higher transmittance with respect to the blue light. Accordingly, the alignment pattern 127 may represent transmittance higher than that of the black matrix 110 with respect to the blue light. However, the present inventive concept is not limited thereto, and the alignment pattern 127 may include green pigments or red pigments. According to the example embodiments, since the first color pattern 125 and the alignment pattern 127 are simultaneously formed, an additional, e.g., separate, process to form the alignment pattern 127 may be omitted.

Referring to FIG. 8, a second color photoresist layer 130 may be formed on the substrate 100 to cover the outer black matrix 112, the dummy black matrix 114, the first color pattern 125, and the alignment pattern 127. The step of forming the second color photoresist layer 130 may be substantially the same as or similar to the step of forming the first color photoresist layer 120 described with reference to FIG. 4, except that the second color photoresist layer 130 includes pigments different from those of the first color photoresist layer 120. For instance, if the first color photoresist layer 120 includes blue pigments, the second color photoresist layer 130 may include green pigments or red pigments. The second color photoresist layer 130 may be formed through a spin coating process. Since the step difference is reduced between the alignment region III having the alignment pattern 127 and the dummy black matrix 114, the color photoresist material may be easily coated through the spin coating process. Accordingly, the second color photoresist layer 130 may be coated at a uniform thickness in the panel region I.

Referring to FIG. 9, the second photoresist layer 130 may be partially exposed by using a second exposure mask 133. The above exposure process may be substantially similar to the exposure process described with reference to FIG. 5. However, when the substrate 100 and the second exposure mask 133 are aligned with each other, the alignment pattern 127 may be used. In other words, in the alignment step, after detecting a location of the alignment pattern 127, the second exposure mask 133 may be aligned based on the location of the alignment pattern 127. Since the alignment pattern 127 has a higher transmittance than that of the dummy black matrix 114 as described above, the location of the alignment pattern 127 may be easily detected.

Accordingly, a second exposure part 130a and a second non-exposure part 130b, which are formed through the exposure process, may have chemical properties different from each other. For instance, the second exposure part 130a and the second non-exposure part 130b may have different solubilities with respect to a specific solvent.

Referring to FIGS. 10 and 11, the second color pattern 135 may be formed by patterning the second color photoresist layer 130. The second non-exposure part 130b may be removed by using a developer representing higher solubility with respect to the second non-exposure part 130b. Accordingly, a portion of the second color photoresist layer 130 remaining in the panel region I may be defined as the second color pattern 135.

Figure 12:
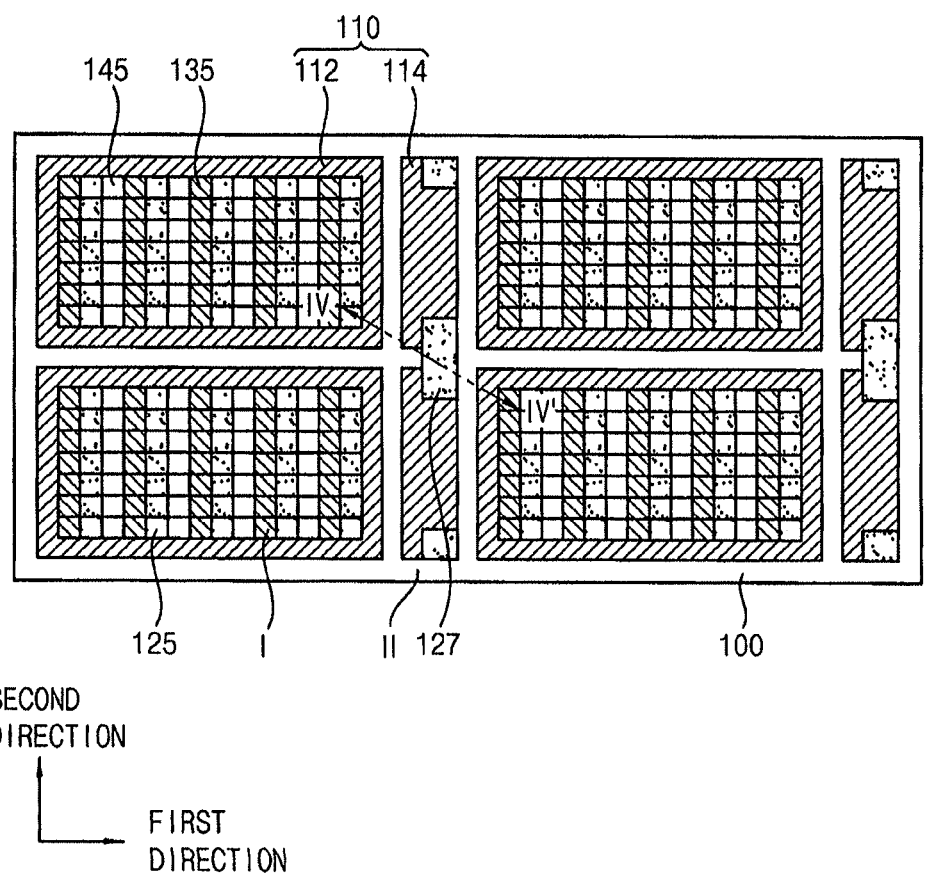

Referring to FIG. 12, a third color pattern 145 may be formed in the panel region I. The step of forming the third color layer 145 may be substantially the same as or similar to the step of forming the second color pattern 135 described with reference to FIGS. 8 to 11. However, the third color pattern 145 may include pigments different from those of the second color pattern 135. For instance, if the second color pattern 135 includes green pigments, the third color pattern 145 may include red pigments.

Although not illustrated, a planarization layer may be additionally formed on the substrate 100 having the first to third color patterns 125, 135, and 145. The planarization layer may include a transparent material and may protect the first to third color patterns 125, 135, and 145 and the black matrix 110.

According to the example embodiments, in the method of manufacturing the optical filter, the first color pattern 125 located in the panel region I and the alignment pattern 127 located in the alignment region III may be simultaneously formed. Since the alignment pattern 127 may have a thickness equal to or similar to that of the black matrix 110, the step difference may be reduced in the alignment region III. Accordingly, the color photoresist layer can be prevented from being irregularly coated due to the step difference. In addition, since the alignment pattern 127 has a higher light transmittance than that of the black matrix 110, the alignment pattern 127 may be used to align the substrate 100 and the exposure masks in the subsequent process.

In contrast, when an alignment pattern in an alignment region is not formed, e.g., during formation of the first color pattern, a step difference, e.g., having a thickness equal to that of the black matrix, may be formed between an upper surface of the substrate and an upper surface of the black matrix. Therefore, when a second color pattern is formed, e.g., by spin coating, on the substrate to cover the black matrix and the first color pattern, the color photoresist material may be coated from a center of the substrate toward an edge of the substrate, so the step difference formed in the alignment region may prevent the color photoresist material from uniform application. In other words, the step difference formed in the alignment region may interfere with application of the color photoresist material, so that the step difference may increase further.

As such, a thinner coated part may be formed in an oblique direction from the center of the substrate toward the edge of the substrate due to the step difference, e.g., a portion of the second color pattern extending from the peripheral region II toward the alignment region III may be thinner and may be obliquely inclined. That is, an oblique pattern may be formed in the panel region I provided at the edge of the substrate, and may have a thickness thinner than that of a remaining portion of the second color pattern. In other words, the oblique pattern having a thinner thickness in the oblique direction may be formed due to the step difference in the alignment region III. Accordingly, light passing through the oblique pattern may have higher brightness than light passing through other parts of the second color pattern, so that a spotted pattern may be observed. In other words, if an alignment pattern that reduces a step difference of the alignment region is not formed, the photoresist material is irregularly coated, thereby forming non-flat portions, e.g., the oblique pattern, causing display defects.

Figure 13:
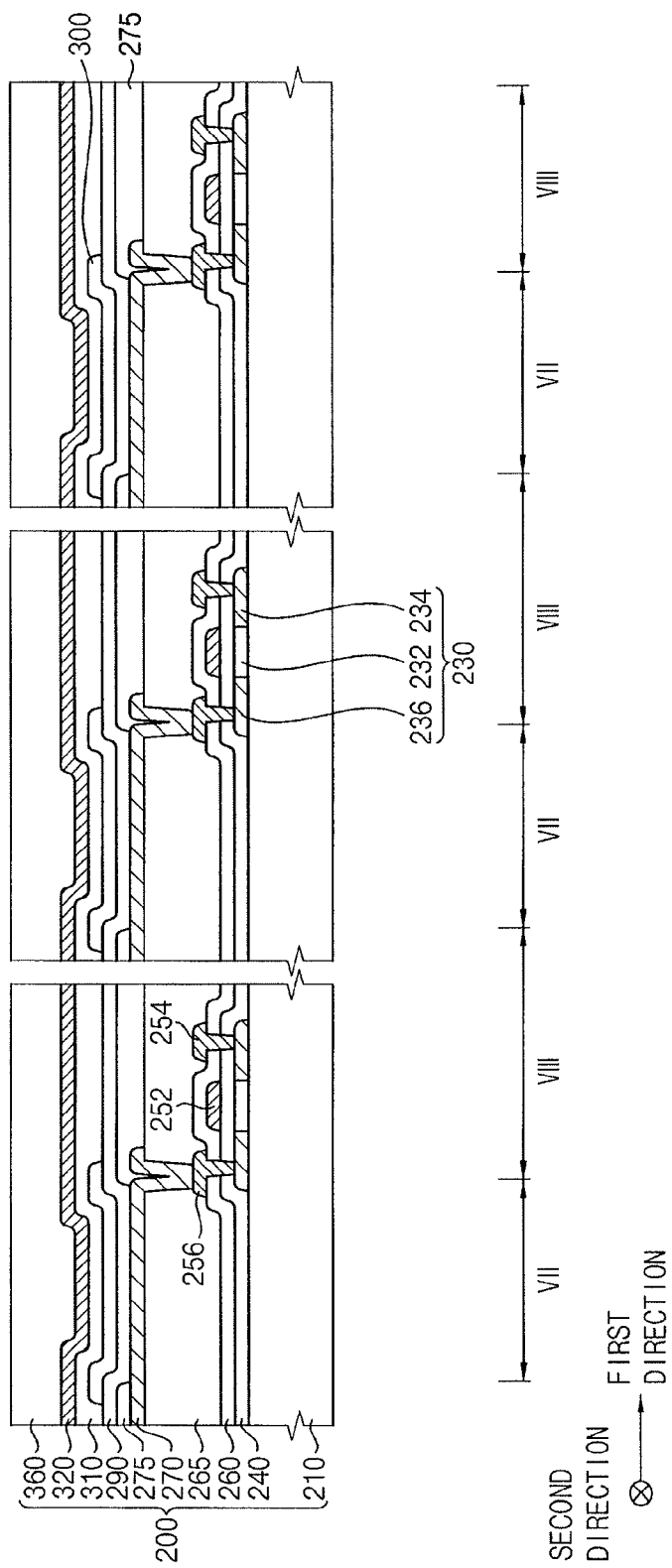
FIGS. 13 and 14 are cross-sectional views of a method of manufacturing an OLED display device including the optical filter according to the example embodiments.

Referring to FIG. 13, a display panel 200 of an OLED display device may be provided. The display panel 200 may include pixel regions VII provided in the first direction and the second direction substantially perpendicular to the first direction, and a non-pixel region VIII surrounding the pixel regions VII.

The display panel 200 may include a first substrate 210, switching structures, a first electrode 270, light emitting structures, and a second electrode 320. For instance, the OLED display device illustrated in FIG. 13 may have a bottom light emitting structure. The switching structures may be provided on the first substrate 210. The first electrode 270 may be located on the switching structures while being electrically connected to the switching structures. The light emitting structures may be interposed between the first electrode 270 and the second electrode 320.

The first substrate 210 may include a transparent insulating substrate. For instance, the first substrate 210 may include a glass substrate, a quartz substrate, or a transparent plastic substrate. According to another example embodiment, the first substrate 210 may include a flexible substrate.

When an active matrix OLED display device is provided, the switching structures may be interposed between the first substrate 210 and the first electrode 270. According to the example embodiments, each of the switching structures may include a switching device such as a transistor and a plurality of insulating layers. When the switching device of each switching structure includes a thin film transistor TFT, the switching device may include a gate electrode 252, a source electrode 254, a drain electrode 256, and a semiconductor layer 230.

A gate signal may be applied to the gate electrode 252, and a data signal may be applied to the source electrode 254. The drain electrode 256 may be electrically connected to the first electrode 270, and the semiconductor layer 230 may electrically make contact with the source electrode 254 and the drain electrode 256. In this case, the semiconductor layer 230 may include a source region 234 connected to the source electrode 254, a drain region 236 making contact with the drain electrode 256, and a channel region 232 interposed between the source region 234 and the drain region 236.

The semiconductor layer 230 may be provided thereon with a gate insulating layer 240 to electrically insulate the gate electrode 252 from the semiconductor layer 230. The gate insulating layer 240 may be provided thereon with a first insulating layer 260 to cover the gate electrode 252. Although the thin film transistor having a top-gate structure, in which the gate electrode 252 is provided on the semiconductor layer 230, is illustrated in FIG. 13 as the switching device, the structure of the switching device is not limited thereto. For instance, the thin film transistor may have a bottom-gate structure in which the gate electrode 252 is located under the semiconductor layer 230.

A second insulating layer 265 of the switching structure may be provided on the first insulating layer 260 while covering the source electrode 254 and the drain electrode 256. Substantially, the second insulating layer 265 may have a flat upper surface.

As illustrated in FIG. 13, each of the light emitting structures may include a hole transport layer (HTL) 290, an organic light emitting layer (EL) 300, and an electron transport layer (ETL) 310. According to the example embodiments, the EL 300 may include a light emitting material to emit red, green, or blue light. According to another example embodiment, the EL 300 may include the mixture of a plurality of light emitting materials to emit lights having different wavelengths. Therefore, the EL 300 may emit white light.

The first electrode 270 may be interposed between the switching structures and the light emitting structures, and the second electrode 320 may be interposed between the light emitting structures and a second substrate 360. In addition, a pixel defining layer 275 may be provided in a region having no first electrode 270 between the switching structure and the light emitting structure.

According to the example embodiments, the EL 300 may be provided in the pixel regions VII, and the pixel defining layer 275 may be provided in the non-pixel region VIII. Therefore, the light generated from the EL 300 is emitted from the pixel regions VII. However, the light may not be emitted from the non-pixel region VIII having the pixel defining layer 275.

According to the example embodiments, the first electrode 270 may correspond to an anode, which provides holes to the HTL 290 of the light emitting structure, and the second electrode 320 may correspond to a cathode which provides electrons to the ETL 310. The first electrode 270 may correspond to a transmissive electrode or a semi-transmissive electrode according to light emitting schemes of the OLED display device, and the second electrode 320 may correspond to a reflective electrode. For instance, the first electrode 270 may include a transparent conductive material such as indium zinc oxide (IZO), indium tin oxide (ITO), tin oxide ($SnO_x$), or zinc oxide ($ZnO_x$), and the second electrode 320 may include metal, such as aluminum (Al), platinum (Pt), silver (Ag), gold (Au), chrome (Cr), tungsten (W), molybdenum (Mo), titanium (Ti), and the alloy thereof, representing higher reflectivity.

The second substrate 360 may be provided on the second electrode 320. The second substrate 360 may include a transparent substrate. For instance, the second substrate 360 may include a glass substrate, or a transparent plastic substrate. Meanwhile, the second substrate 360 may include a flexible substrate. Although the second substrate 360 may include a material substantially the same as a material constituting the first substrate 210 according to the example embodiments, the first and second substrates 210 and 360 may include materials different from each other.

Figure 14:
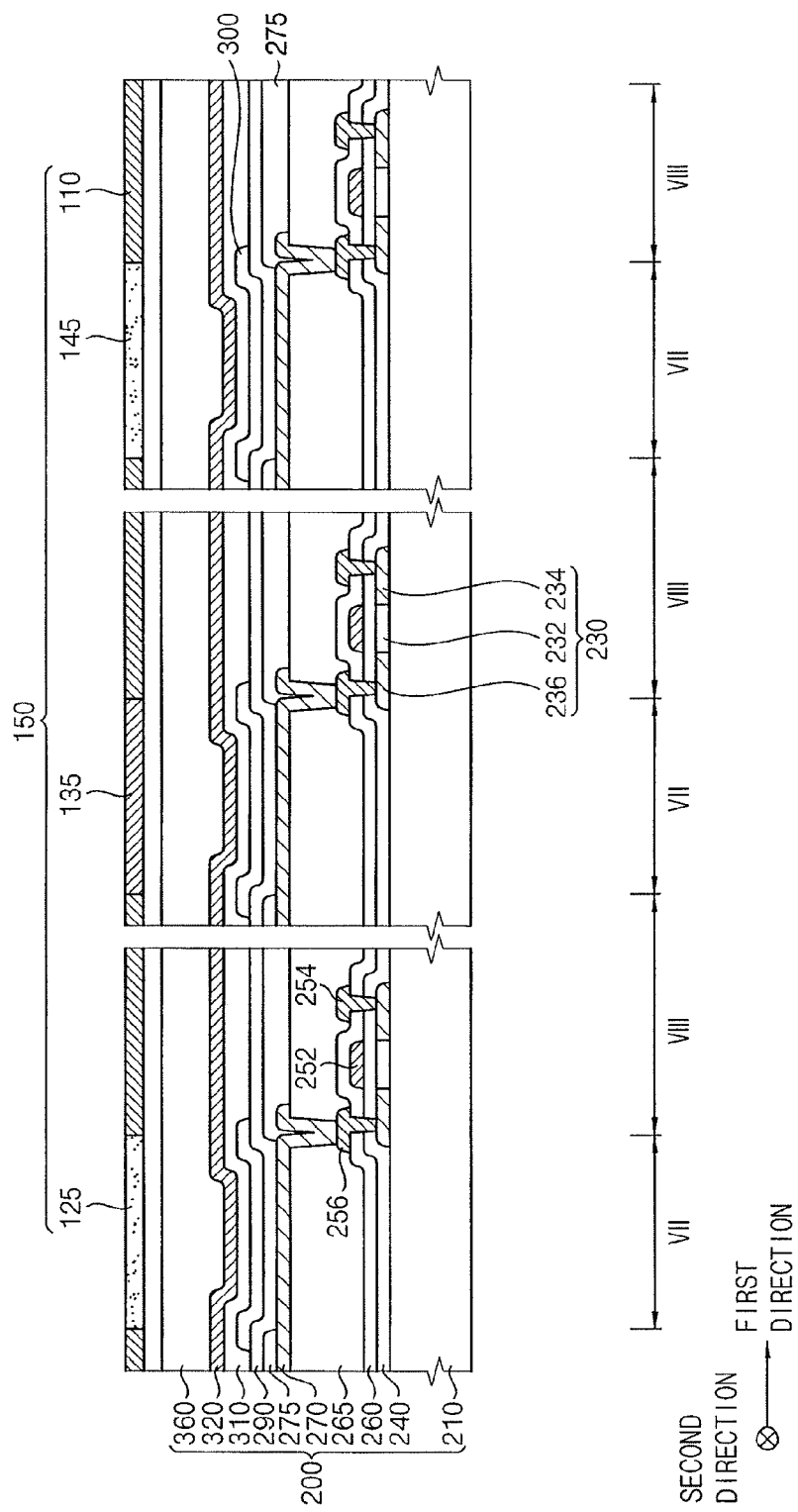

Referring to FIG. 14, an optical filter 150 may be provided on the display panel 200. The method of manufacturing the optical filter 150 may be substantially the same as or similar to the method of manufacturing the optical filter described with reference to FIGS. 1 to 12. Accordingly, the details thereof will be omitted in order to avoid redundancy.

The optical filter 150 may include the first to third color patterns 125, 135, and 145, and the black matrix 110. Although not illustrated in FIGS. 1 to 12, the black matrix 110 may be disposed among the first to third color patterns 125, 135 and 145.

The first to third color patterns 125, 135, and 145 of the optical filter 150 may be provided corresponding to the pixel region VII of the display panel 200. Accordingly, the light generated from the EL 300 may be converted into red, green, or blue light while passing through the first to third color patterns 125, 135, and 145.

The optical filter 150 according to the example embodiments may include the first to third color patterns 125, 135, and 145 having a uniform thickness. Accordingly, an oblique pattern can be prevented from being formed in the OLED display device having the optical filter 150. The present inventive concept may be applied to a system having an organic light emitting display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

By way of summary and review, in the method of manufacturing an optical filter, the first color pattern located in the panel region and the alignment pattern located in the alignment region are simultaneously formed. Since the alignment pattern may have a thickness equal to or similar to that of the black matrix, a step difference may be reduced in the alignment region. Therefore, the color photoresist layer may be prevented from being irregularly coated. In addition, since the alignment pattern has a higher light transmittance than that of the black matrix, the alignment pattern may be used to align the substrate and the mask in the subsequent process. In contrast, if the color patterns have an irregular thickness, stains may be caused due to variation in brightness of the emitted light The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an optical filter, the method comprising:

preparing a substrate having a panel region, a peripheral region, and an alignment region;

forming an outer black matrix on the substrate, such that the outer black matrix surrounds the panel region;

forming a dummy black matrix on the substrate, such that the dummy black matrix is in the peripheral region while exposing the alignment region;

forming a first color photoresist layer on the substrate to cover the outer black matrix and the dummy black matrix;

forming a first color pattern in the panel region and an alignment pattern in the alignment region by patterning the first color photoresist layer;

forming a second color photoresist layer on the substrate to cover the outer black matrix, the dummy black matrix, the first color pattern, and the alignment pattern;

forming a second color pattern in the panel region by patterning the second color photoresist layer; and forming a third color pattern in the panel region.

2. The method of claim 1, wherein forming the alignment pattern includes forming an alignment pattern having a higher light transmittance than a light transmittance of the dummy black matrix, and having a thickness of about one to 1.5 times thicker than a thickness of the dummy black matrix.

3. The method of claim 2, wherein forming the second color pattern includes:
providing an exposure mask opposite the substrate;
aligning the exposure mask with the substrate by using the alignment pattern; and
partially exposing the second color photoresist layer by using the exposure mask.

4. The method of claim 2, wherein forming the alignment pattern includes using a material identical to a material of the first color pattern.

5. The method of claim 2, wherein the first color pattern and the alignment pattern exhibit high transmittance of a blue light.

6. The method of claim 2, wherein forming the alignment pattern includes reducing a step difference between the alignment region and the peripheral region.

7. The method of claim 6, wherein forming the second color photoresist layer includes a spin coating process.

8. The method of claim 1, wherein forming the alignment pattern includes forming a pattern having a shape of a cross, a triangle, a circle, or a rectangle, when viewed in a plan view.

9. The method of claim 1, wherein forming the first color photoresist layer includes using a negative photoresist.

10. The method of claim 1, wherein forming the dummy black matrix includes depositing the dummy black matrix to a same thickness as the outer black matrix.

11. The method of claim 1, wherein forming the first color pattern and the alignment pattern is simultaneous, the alignment pattern filling a space between a dummy black matrix and an adjacent outer black matrix.

12. The method of claim 11, wherein forming the alignment pattern includes forming the alignment pattern to a same thickness as each of the dummy black matrix and outer black matrix.

13. A method of manufacturing an organic light emitting diode display device, the method comprising:
forming a display panel including a switching device, a first electrode, an organic light emitting structure, a second electrode, a plurality of pixel regions arranged in a first direction and a second direction perpendicular to the first direction, and a non-pixel region surrounding the pixel regions; and
forming an optical filter on the display panel, forming the optical filter including:
preparing a substrate having a panel region, a peripheral region, and an alignment region,
forming an outer black matrix on the substrate, such that the outer black matrix surrounds the panel region,
forming a dummy black matrix on the substrate, such that the dummy black matrix is in the peripheral region while exposing the alignment region,
forming a first color photoresist layer on the substrate to cover the outer black matrix and the dummy black matrix,
forming a first color pattern in the panel region and an alignment pattern in the alignment region by patterning the first color photoresist layer,
forming a second color photoresist layer on the substrate to cover the outer black matrix, the dummy black matrix, the first color pattern, and the alignment pattern,
forming a second color pattern in the panel region by patterning the second color photoresist layer, and
forming a third color pattern in the panel region.

14. The method of claim 13, wherein forming the alignment pattern includes forming an alignment pattern having a higher light transmittance than a light transmittance of the dummy black matrix, and having a thickness of about one to 1.5 times thicker than a thickness of the dummy black matrix.

15. The method of claim 14, wherein forming the second color pattern includes:
providing an exposure mask opposite the substrate;
aligning the exposure mask with the substrate by using the alignment pattern; and
partially exposing the second color photoresist layer by using the exposure mask.

16. The method of claim 14, wherein forming the alignment pattern includes reducing a step difference between the alignment region and the peripheral region.

17. The method of claim 13, wherein forming the second color photoresist layer includes a spin coating process.

* * * * *